(12) United States Patent
You et al.

(10) Patent No.: US 6,556,493 B2
(45) Date of Patent: Apr. 29, 2003

(54) METHOD FOR TESTING MEMORY CELL IN SEMICONDUCTOR DEVICE

(75) Inventors: Young-Seon You, Ichon (KR); Yoon-Soo Jang, Ichon (KR); Mun-Hwa Lee, Ichon (KR); Tae-Kyu Kim, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/028,308

(22) Filed: Dec. 28, 2001

(65) Prior Publication Data

US 2002/0136071 A1 Sep. 26, 2002

(30) Foreign Application Priority Data

Dec. 29, 2000 (KR) .......................................... 2000-85461

(51) Int. Cl.[7] .................................................. G11C 7/00
(52) U.S. Cl. .................... 365/201; 365/211; 365/185.2; 365/185.22
(58) Field of Search ................................ 365/201, 210, 365/211, 185.22, 185.2, 185.21, 185.11, 185.3, 185.09, 185.18, 185.24

(56) References Cited

U.S. PATENT DOCUMENTS

| | | | | |
|---|---|---|---|---|
| 5,717,632 A | * | 2/1998 | Richart et al. | ........... 365/185.2 |
| 5,774,395 A | * | 6/1998 | Richart et al. | ........... 365/185.3 |
| 6,118,706 A | * | 9/2000 | Smayling et al. | ...... 365/185.33 |
| 6,288,944 B1 | * | 9/2001 | Kawamura | ............. 365/185.22 |

* cited by examiner

*Primary Examiner*—David Nelms
*Assistant Examiner*—Gene N. Auduong
(74) *Attorney, Agent, or Firm*—Birch, Stewart, Kolasch & Birch, LLP

(57) ABSTRACT

A method for testing a memory cell of the semiconductor device includes the steps of determining a reference memory cell and setting a first trip point by measuring a first drain current of a reference memory cell, testing an erasure verifying memory cell to be tested at a room temperature, detecting a fourth drain current by measuring the erasure verifying memory cell at a hot temperature and comparing the fourth drain current with the first drain current, varying the first drain trip point according to a current difference between the firs and the fourth drain currents and setting a second trip point of the erasure verifying memory cell according to the varied first trip point.

9 Claims, 7 Drawing Sheets

METHOD FOR TESTING MEMORY CELL IN SEMICONDUCTOR DEVICE

This nonprovisional application claims priority under 35 U.S.C. §119(a) on Patent Application No. 2000-85461 filed in Republic of Korea on Dec. 29, 2000, which is herein incorporated by reference.

FIELD OF THE INVENTION

The present invention relates to a method for testing a memory cell in semiconductor device; and, more particularly, to a method for optimally testing a memory cell by setting a new trip point of a reference memory cell according to a variation of temperature.

DESCRIPTION OF RELATED ART

Generally, a predetermined test is carried out to increase reliability of a semiconductor device after a fabrication process of the semiconductor device is completed. The semiconductor devices are classified into normal goods and failed goods after the predetermined test.

Recently, as users using the semiconductor device demand reliability for wide parts of the semiconductor device, problems generated according to the conventional test of the semiconductor device become an important factor.

For example, referring to FIG. 1, characteristics of gate voltage Vg and a drain current Id are changed according to a temperature environment, such as a cold, room or hot temperature, when a test is carried out.

As compared with a test at a room temperature, a low drain current Id flows at low gate voltage Vg and a high drain current Id flows at high gate voltage Vg when a test is carried out at a cold temperature. As compared with a test at a room temperature, a high drain current Id flows at low gate voltage Vg and a low drain current Id flows at high gate voltage Vg when a test is carried out at a hot temperature. It is a physical phenomenon. When the gate voltage Vg is low at a hot temperature, the drain current Id is nearly a leakage current in a junction portion and, when the gate voltage Vg is high at a hot temperature, the drain current Id is nearly current flowing from a source to a drain.

Namely, when the test is carried out at a hot temperature, the drain current Id is higher at low gate voltage Vg than the drain current Id at the room temperature due to the leakage current and the drain current is lower at high gate voltage Vg than the drain current Id at the room temperature due to scattering of electrons and lattice. On the other hand, when the test is carried out at a cold temperature, an inverse characteristic is shown.

Referring to FIG. 2, to solve the above problem, a test carried out at a trip point, as a test operation point, which has a constant point independent of the variation of temperature. However, since the identical drain current does not always flow in memory cells in the semiconductor device, it is difficult that a reference drain current is always maintained in an identical level. The drain current Id is varied according to a characteristic of a unit cell in a memory of the semiconductor device as shown in FIG. 3. The drain current Id may be represented as a dotted line or a solid line in FIG. 3 according to a characteristic of each memory cell for the variation of temperature. Since the drain current Id does not identically flow at each memory cell in the semiconductor device, it is difficult that a level of the drain current Id is always maintained in the same level.

A read margin of the memory cells, of which threshold voltage Vt is different from each other, is determined by gate voltage Vg and a temperature as shown in table 1.

TABLE 1

|  |  | Hot | Cold |
|---|---|---|---|
| Low Vg. | First cell | Fail | Good |
|  | Second cell | Good | Fail |
| High Vg. | First cell | Good | Fail |
|  | Second cell | Fail | Good |

In table 1, the first cell represents that electrons do not exist in a floating gate in memory cells of the semiconductor device, which is in an erasure state, and the second cell represents that electrons exist in a floating gate in memory cells of the semiconductor device, which is a program state.

Data are read when the low gate voltage is applied to a memory cell having a different drain current characteristic (for example, a memory cell having the highest threshold voltage) at a hot temperature. Since the drain current flowing in the memory cell is not the same as the reference drain current, the trip point is moved to left as much as ΔI. Accordingly, the memory cell is failed at the hot temperature. Namely, it is the same case as that data are written at the polar region and the data are read at the equatorial region.

The first cell may be failed at low gate voltage Vg and at a hot temperature and the second cell may be failed at a low gate voltage and at a cold temperature or at high gate voltage and at a hot temperature.

The method for testing a memory cell of the semiconductor device according to the prior art is that the trip point of the predetermined memory cell is set as a reference trip point and other memory cells are determined whether the memory cells are good or failed on the basis of the reference trip point. However, temperature variation is not considered and the conventional testing method has been carried out at a room temperature so that an accurate test of the memory cell in the semiconductor device cannot be expected.

SUMMARY OF THE INVENTION

It is, therefore, an object of the present invention to provide a method for testing a memory cell of the semiconductor device capable of optimally measuring a reference drain voltage according to a test temperature and characteristics of the memory cell.

In accordance with an aspect of the present invention, there is provided a method for testing a memory cell of the semiconductor device, comprising the steps of: a) determining a reference memory cell and setting a first trip point by measuring a first drain current of a reference memory cell; b) testing an erasure verifying memory cell to be tested at a room temperature; c) testing the erasure verifying memory cell at a hot temperature; d) programming the reference memory cell; and e) setting a second trip point by varying the first trip point.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a method for accurately testing a memory cell of the semiconductor device according to the present invention will be described in detail referring to the accompanying drawings.

Figure 1:
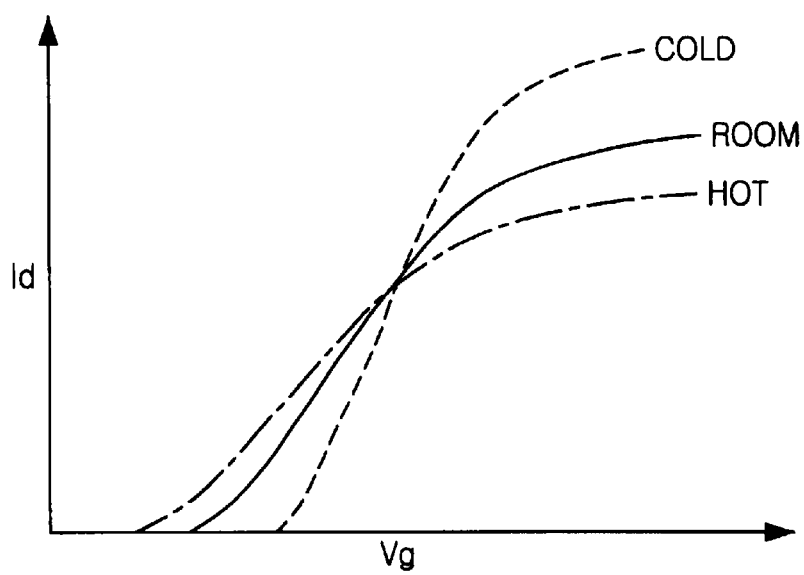
FIG. 1 is a graph showing a curve of drain current to gate voltage in a semiconductor device for a variation of temperature.
Figure 2:
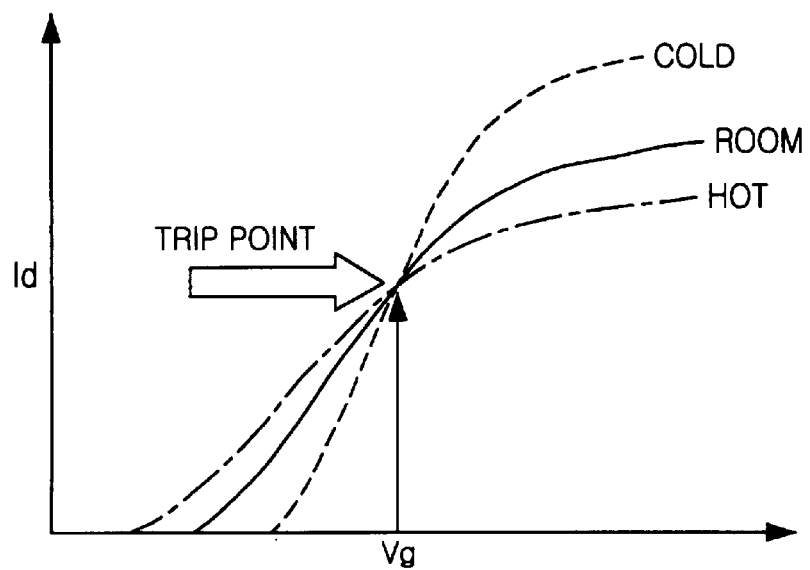
FIG. 2 is a graph showing a trip point in FIG. 1.
Figure 3:
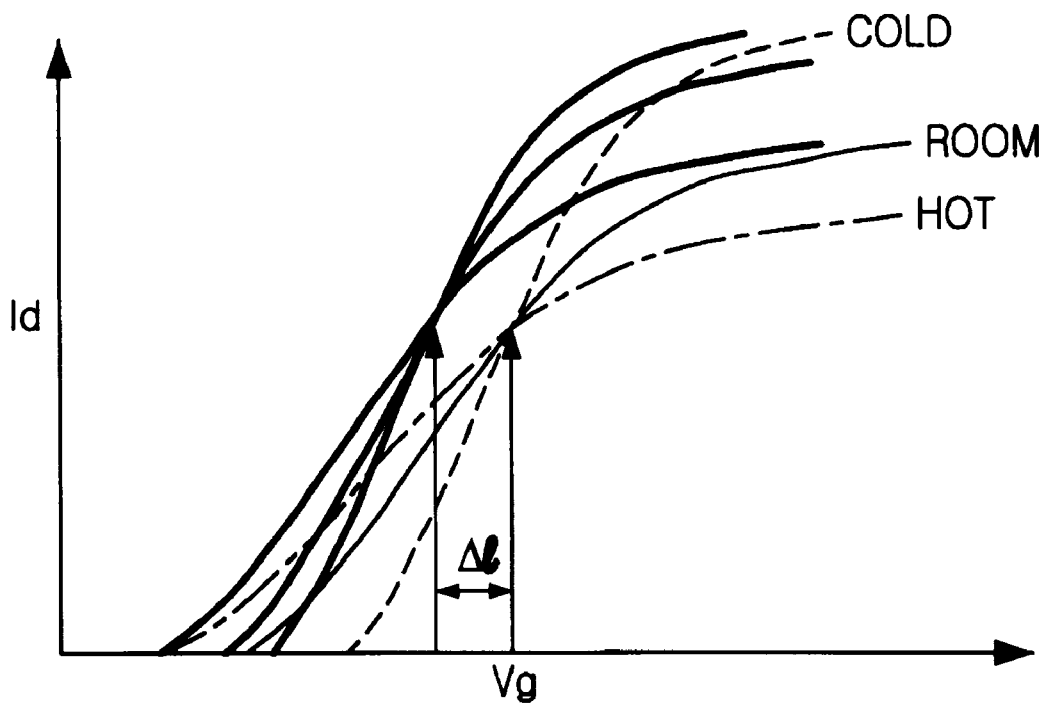
FIG. 3 is a graph showing a variation of the trip point according to a characteristic of each cell.
Figure 4:
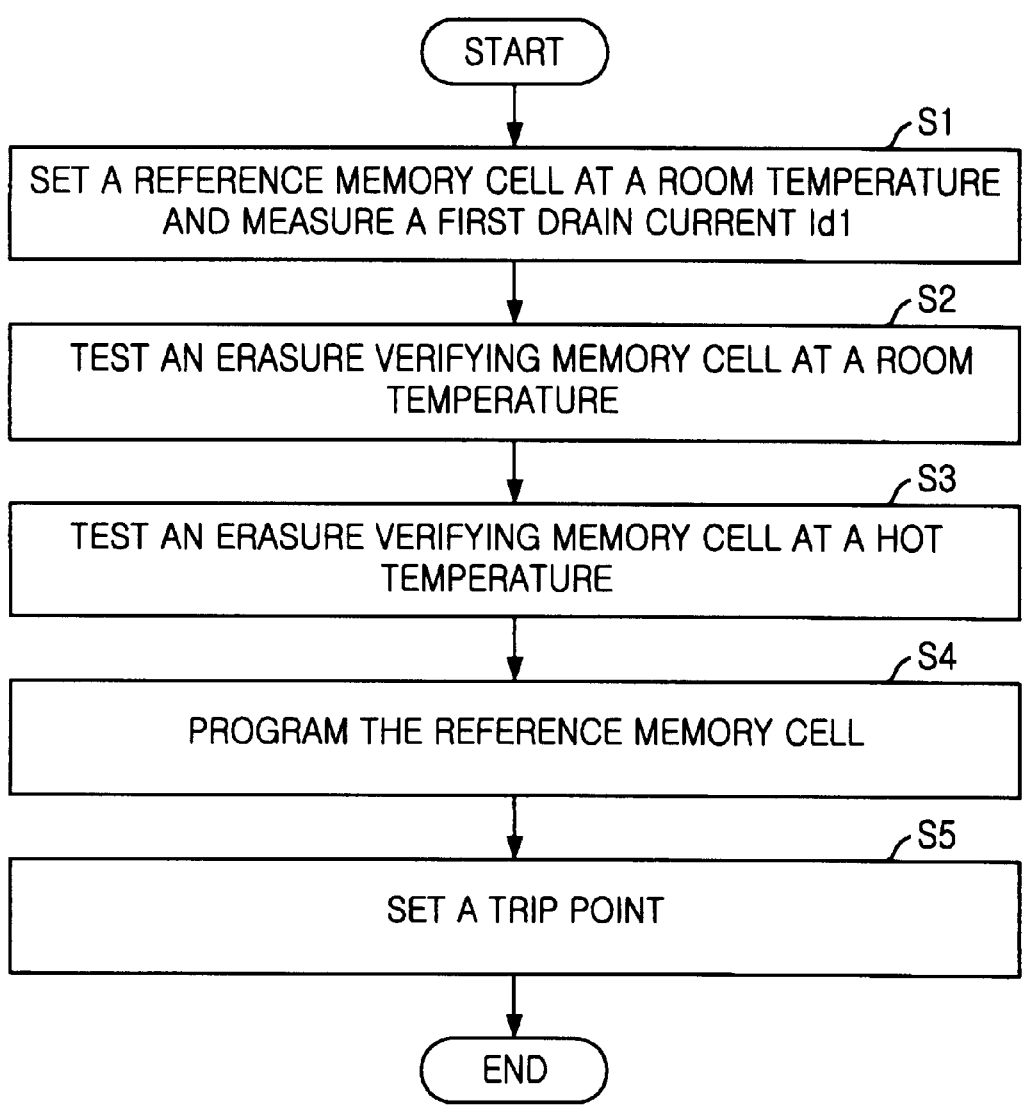
FIG. 4 is a flow chart showing a method for testing a memory cell of the semiconductor device according to the present invention.

FIG. 4 is a flow chart showing a method for testing a memory cell of the semiconductor device according to the present invention.

Referring to FIG. 4, a method for testing a memory cell of the semiconductor device according to the present invention is carried before the memory cells are aligned by selecting normal memory cells among the memory cells of the semiconductor device. A predetermined memory cell is determined as a reference memory cell among the memory cells of the semiconductor device and a first drain current Id1 is set at a room temperature at step S1. An erasure verifying memory cell is tested at step S2 at a room temperature and the erasure verifying memory cell is tested at a hot temperature at step S3. The reference memory cell is programmed at step S4 and a new trip point is set at step S5.

Figure 5:
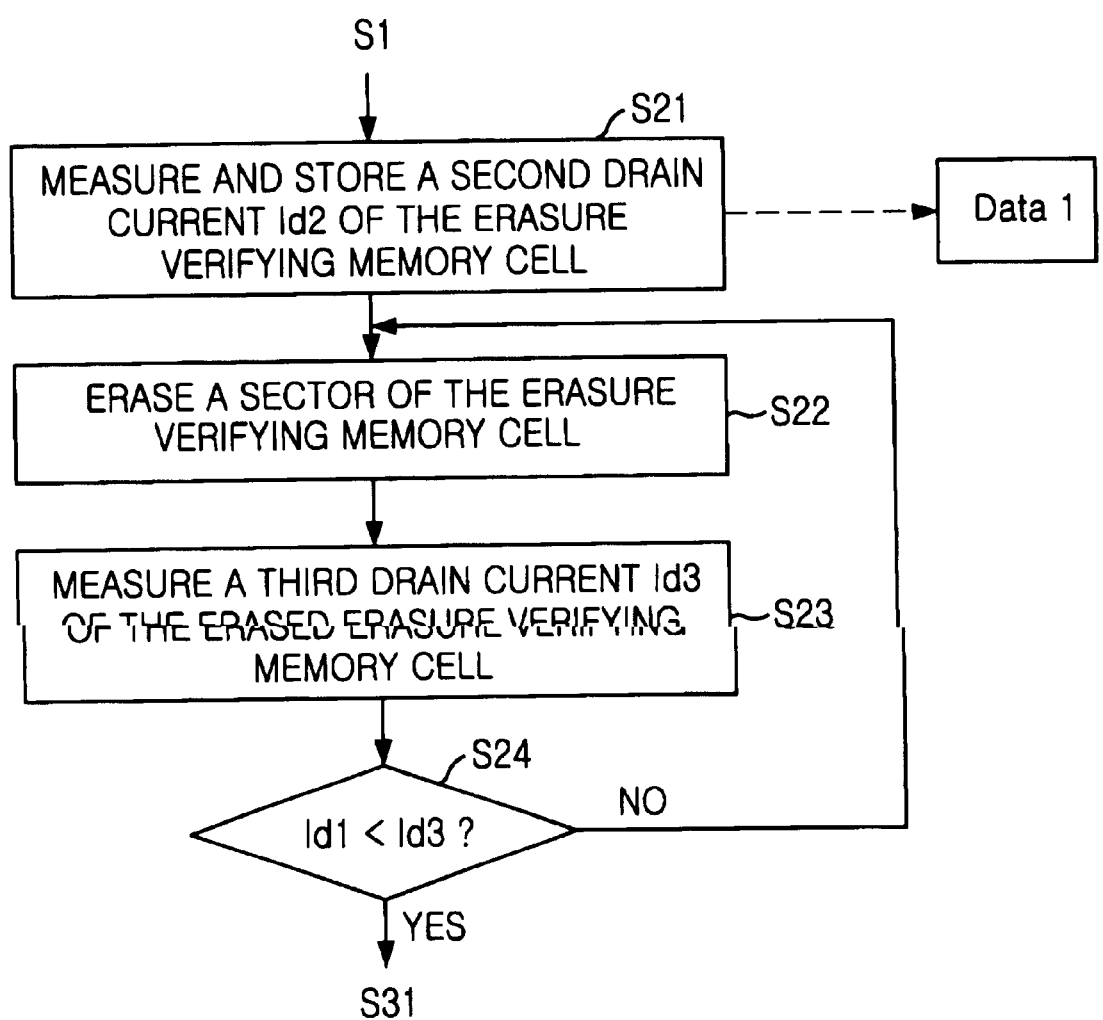
FIG. 5 is a detailed flow chart showing the step testing the erasure verifying memory cell at a hot temperature in FIG. 4 according to the present invention.

FIG. 5 is a detailed flow chart showing the step S2 in FIG. 4 according to the present invention.

Referring to FIG. 5, after the erasure verifying memory cell is erased, a second drain current Id2 flowing in the erasure verifying memory cell is measured and stored as a Data1 at step S21 and a sector of the erasure verifying memory cell is erased at step S22. A third drain current Id3 of the erased erasure verifying memory cell is measured at step S23 and the first drain current Id1 and the third drain current Id3 are compared at step S24.

When the first drain current Id1 and the third drain current Id3 are compared at step S24, if the third drain current Id3 is high or equal to the first drain current Id1, the step goes to the step S3 and, if not, the step goes to the step S22.

Figure 6:
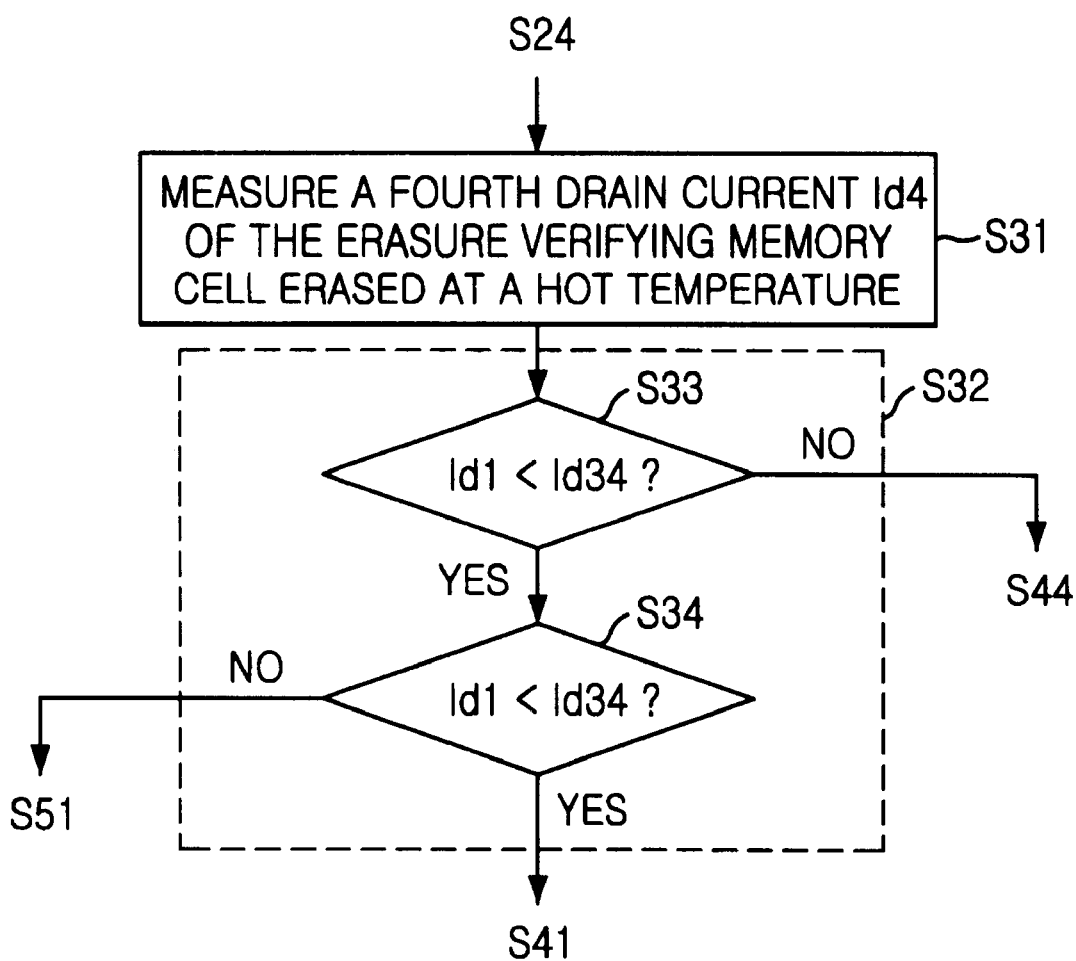
FIG. 6 is a detailed flow chart showing the step measuring the erasure verifying memory cell in FIG. 4 according to the present invention.

FIG. 6 is a detailed flow chart showing the step S3 in FIG. 4 according to the present invention.

Referring to FIG. 6, a forth drain current Id4 is detected by that the drain current of the erasure verifying memory cell is measured at step S31 and the first drain current Id1 and the fourth drain current Id4 are compared at step S32.

When the first drain current Id1 and the fourth drain current Id4 are compared, a first comparison is carried out at step S33 and a second comparison is carried out at step S34. In the first comparison, if the fourth drain current Id4 is high or equal to the first drain current Id1, the second comparison is carried out and, if not, the step goes to a step S44. In the second comparison, if the first drain current Id1 is equal to the fourth drain current Id4, the step goes to a step S51 and, if not, the step goes to a step S41.

Figure 7:
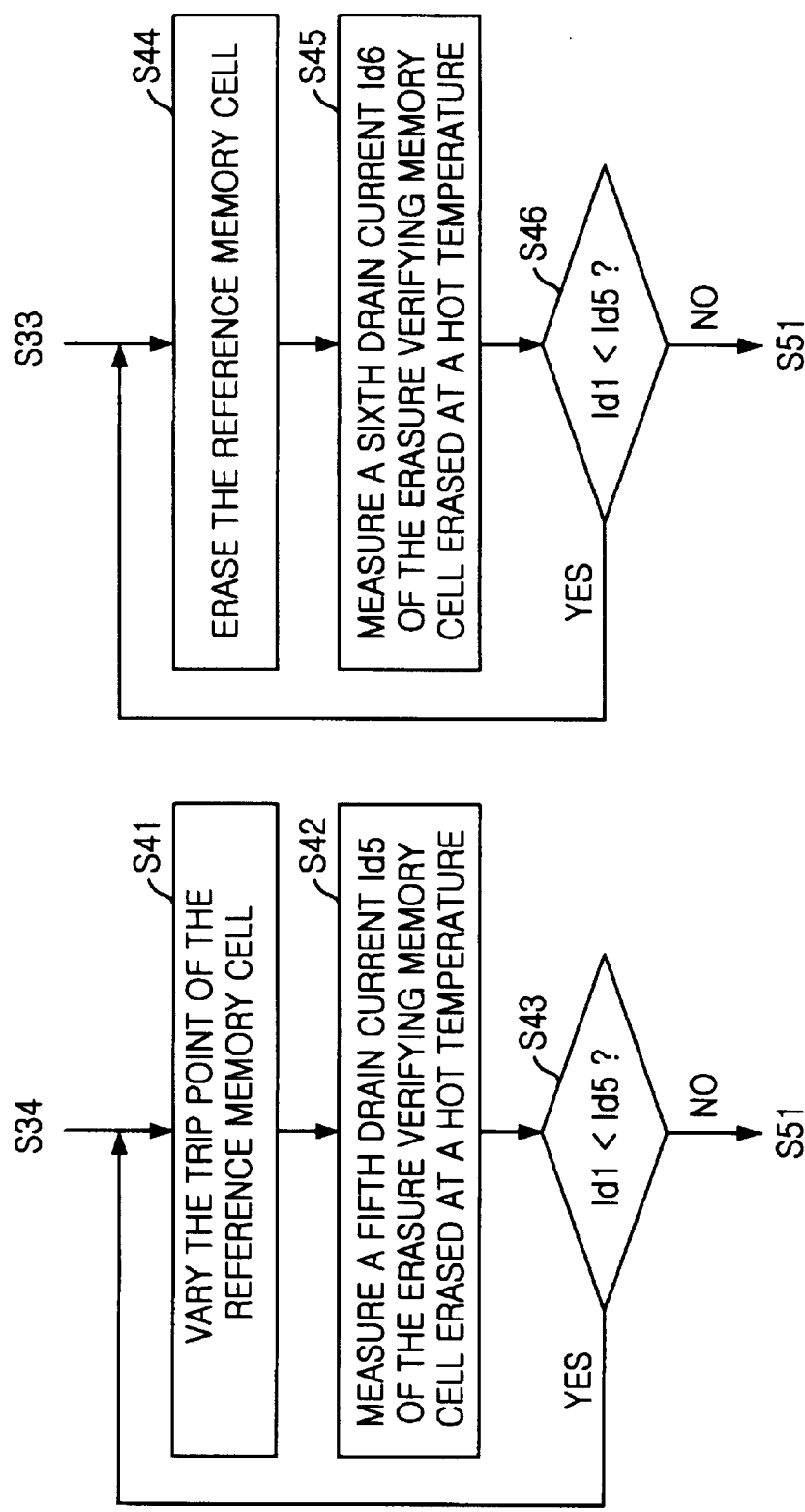
FIG. 7 is a detailed flow chart showing the step programming the reference memory cell in FIG. 4 according to the present invention.

FIG. 7 is a detailed flow chart showing the step S4 in FIG. 4 according to the present invention.

Referring to FIG. 7, in the second comparison, a current difference between the first drain current Id1 and the fourth drain current Id4 is measured and the trip point of the reference memory cell is varied as much as the measured current difference at step S41. A fifth drain current Id5 of the erasure verifying memory cell erased at a hot temperature is measured at step S42 and the fifth drain current Id5 and the first drain current Id1 are compared at step S43. If the fifth drain current Id5 is high or equal to the first drain current Id1, the step goes to the step S41 and, if not, the step goes to a step S51.

Also, in the first comparison, when the first drain current Id1 is higher than the fourth drain current Id4, the reference memory cell is erased at step S44. A sixth drain current Id6 of the erasure verifying memory cell is measured at step S45. The sixth drain current Id6 and the first drain current Id1 are compared at step S46. If the sixth drain current Id6 is high or equal to the first drain current Id1, the step goes to a step S51 and, if not, the step goes to the step S44.

Figure 8:
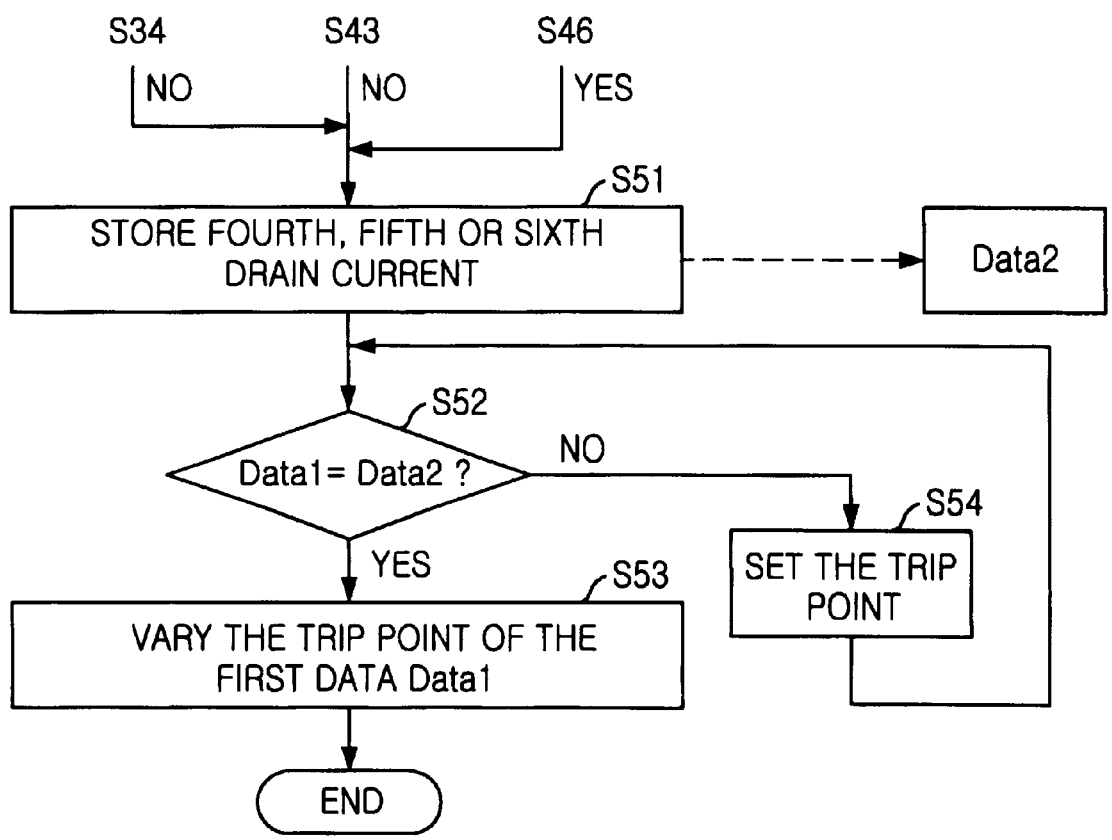
FIG. 8 is a detailed flow chart showing the step setting the trip point in FIG. 4 according to the present invention.

FIG. 8 is a detailed flow chart showing the step S5 in FIG. 4 according to the present invention.

Referring to FIG. 8, one drain current is selected among the forth, fifth and sixth drain currents and stored as a second data Data2 at step S51. When the first data Data1 and the second data Data2 are compared, if the two data are the same, the trip point is finally set at step S51 and, if not, the trip point of the first data Data1 is varied at step S54.

After the trip point of the erasure verifying memory cell is measured at a hot temperature, the trip point is compared with that of the reference memory cell and then a new trip point of the reference memory cell is set so that a test of the memory cell of the semiconductor device can be optimally carried out.

Accordingly, the desired reliability of the goods may be secured.

While the present invention has been described with respect to the particular embodiments, it will be apparent to those skilled in the art that various changes and modifications may be made without departing from the spirit and scope of the invention as defined in the following claims.

What is claimed is:

1. A method for testing a memory cell of the semiconductor device, comprising the steps of:
   a) determining a reference memory cell and setting a first trip point by measuring a first drain current of a reference memory cell;
   b) testing an erasure verifying memory cell to be tested at a room temperature, wherein the step b) includes the steps of:
      b1) measuring and storing a second drain current flowing in the erasure verifying memory cell as a first data at a room temperature after erasing the erasure verifying memory cell;
      b2) erasing a sector of the erasure verifying memory cell;
      b3) measuring a third drain current of the erasure verifying memory cell at a room temperature; and
      b4) comparing the first drain current with the third drain current;

c) detecting a fourth drain current by measuring the erasure verifying memory cell at a hot temperature and comparing the fourth drain current with the first drain current;

d) varying the first drain trip point according to a current difference between the firs and the fourth drain currents; and e) setting a second trip point of the erasure verifying memory cell according to the varied first trip point.

2. The method as recited in claim 1, wherein, in the step b4), if the third drain current is high or equal to the first drain current, the third drain current is read out.

3. The method as recited in claim 1, wherein, in the step b4), if the third drain current is lower than the first drain current, the step b2) is carried out.

4. The method as recited in claim 1, wherein, in the step c), if the fourth drain current is higher than the first drain current, the step d) is carried out.

5. The method as recited in claim 1, wherein, in the step c), if the fourth drain current is equal to the first drain current, the step e) is carried out.

6. The method as recited in claim 5, wherein, in the step c), if the fourth drain current is lower than the first drain current, the reference memory cell is erased at step d).

7. The method as recited in claim 6, wherein the step d) further includes the steps of:

d1) measuring a fifth drain current of the erasure verifying memory cell; and d2) comparing the fifth drain current with the first drain current, wherein, if the fifth drain current is high or equal to the first drain current, the step d) is carried out and, if not, the step e) is carried out.

8. The method as recited in claim 7, wherein the step d) further includes the steps of:

d3) erasing the reference memory cell when the fourth drain current is lower than the first drain current;

d4) measuring a sixth drain current of the erasure verifying memory cell at a hot temperature; and d5) comparing the sixth drain current with the first drain current, wherein, if the sixth drain current is high or equal to the first drain current, the step e) is carried out and, if not, the step d4) is carried out.

9. The method as recited in claim 8, wherein the step e) comprises the steps of:

e1) storing one drain current selected from fourth, fifth and sixth drain currents as a second data; and e2) comparing the first data with the second data, wherein, if the first data and the second data are the same, the trip point is finally set, and, if not, the first trip point is varied.

* * * * *